(12) United States Patent
Yin et al.

(10) Patent No.: US 7,525,162 B2
(45) Date of Patent: Apr. 28, 2009

(54) ORIENTATION-OPTIMIZED PFETS IN CMOS DEVICES EMPLOYING DUAL STRESS LINERS

(75) Inventors: Haizhou Yin, Poughkeepsie, NY (US); Katherine L. Saenger, Ossining, NY (US); Chun-Yung Sung, Poughkeepsie, NY (US); Kai Xiu, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 11/850,933

(22) Filed: Sep. 6, 2007

(65) Prior Publication Data

US 2009/0065867 A1   Mar. 12, 2009

(51) Int. Cl.
*H01L 21/00* (2006.01)
(52) U.S. Cl. .................. 257/369; 257/255; 257/288; 257/347; 257/351; 257/E21.633; 257/E21.415
(58) Field of Classification Search ................. 257/369, 257/347, 351, 255, 367, E21.633, E21.415, 257/E21.433, E21.431, 288
See application file for complete search history.

(56) References Cited

U.S. PATENT DOCUMENTS

| 7,312,485 | B2 * | 12/2007 | Armstrong et al. ........... 257/255 |
| 7,354,806 | B2 * | 4/2008 | Doris et al. ................. 438/149 |
| 2005/0093030 | A1 | 5/2005 | Doris et al. |
| 2006/0019438 | A1 | 1/2006 | Harakawa |
| 2006/0094182 | A1 | 5/2006 | Hanafi et al. |
| 2006/0128091 | A1 | 6/2006 | Chidambarrao et al. |
| 2006/0199326 | A1 | 9/2006 | Zhu et al. |
| 2006/0284255 | A1 * | 12/2006 | Shin et al. .................. 257/351 |
| 2008/0042215 | A1 * | 2/2008 | Ieong et al. ................ 257/369 |
| 2008/0217700 | A1 * | 9/2008 | Doris et al. ................. 257/382 |

OTHER PUBLICATIONS

U.S. Appl. No. 11/327,256, Inventor: Massimo Fischetti et al., Title: Higher Performance CMOS on (110) Wafers, filed Jan. 6, 2006.
Gehres, R., et al., "High volume manufacturing ramp in 90 nm dual stress liner technology", 2006 IEEE/SEMI Advanced Semiconductor Manufacturing Conference and Workshop, May 22, 2006, Boston, MA; Published by IEEE, Piscataway, NJ (IEEE Cat. No. 6CH37782C), pp. 6.

(Continued)

*Primary Examiner*—Sue A Purvis
*Assistant Examiner*—Fazli Erdem
(74) *Attorney, Agent, or Firm*—Scully, Scott, Murphy & Presser, P.C.; Robert M. Trepp, Esq.

(57) ABSTRACT

A PFET is provided on a silicon layer having a (110) surface orientation and located in a substrate. A compressive stress liner disposed on the gate and source/drain regions of the PFET generates a primary longitudinal compressive strain along the direction of the PFET channel. A tensile stress liner disposed on at least one NFET located transversely adjacent to the PFET generates a primary longitudinal tensile strain along the direction of the NFET channel. A secondary stress field from the at least one NFET tensile liner generates a beneficial transverse tensile stress in the PFET channel. The net benefits of the primary compressive longitudinal strain and the secondary tensile transverse stress are maximized when the azimuthal angle between the direction of the PFET channel and an in-plane [1 $\bar{1}$ 0] crystallographic direction in the (110) silicon layer is from about 25° to about 55.

21 Claims, 7 Drawing Sheets

OTHER PUBLICATIONS

Kanda, Y., "A Graphical Representation of the Piezoresistance Coefficients in Silicon," IEEE Transactions on Electron Devices, vol. ED-29, pp. 64-70, No. 1, Jan. (1982).

Sheraw, C.D., et al., "Dual stress liner enhancement in hybrid orientation technology", 2005 Symposium on VLSI Technology, Jun. 14-16, 2005, Kyoto, Japan; Published by IEEE, Piscataway, NJ, USA (IEEE Cat. No. 05CH37642), pp. 12-13, 2005.

Singh, D.V. et al., "Stress memorization in high-performance FDSOI devices with ultra-thin silicon channels and 25 nm gate lengths", International Electron Devices Meeting (IEDM) 2005, Dec. 5-7, 2005, Washington, DC; Published by IEEE, Piscataway, NJ (IEEE Cat. No. 05CH37703C, pp. 4.

Yang, H.S., et al., "Dual stress liner for hugh performance sub-45 nm gate length SOI CMOS manufacturing", International Electron Devices Meeting (IEDM), Piscataway, NJ, (IEEE) Cat. No. 04CH37602), pp. 1075-1077.

* cited by examiner

ORIENTATION-OPTIMIZED PFETS IN CMOS DEVICES EMPLOYING DUAL STRESS LINERS

FIELD OF THE INVENTION

The present invention generally relates to semiconductor devices for integrated circuits, and particularly to orientation-optimized p-type field effect transistors (PFETs) in complementary metal oxide semiconductor (CMOS) transistors employing dual stress liners.

BACKGROUND OF THE INVENTION

Continuous scaling of silicon-based metal oxide semiconductor field effect transistors (MOSFETs) has contributed to relentless advances in semiconductor technology. As the device scale approaches nanometer ranges, further scaling of semiconductor devices faces various challenges. In light of this, many methods of improving device performance without resorting to scaling have recently been explored.

One widely adopted approach for improving performance of semiconductor devices without relying on scaling is to increase carrier (electron or hole) mobility in a MOSFET. When stress is applied to the channel of a semiconductor transistor, the mobility of carriers, and as a consequence, the transconductance and the on-current of the transistor are altered from their original values for an unstressed semiconductor. This is because the applied stress and the resulting strain on the semiconductor structure within the channel affects the band gap structure (i.e., breaks the degeneracy of the band structure) and changes the effective mass of carriers. The effect of the stress depends on the crystallographic orientation of the plane of the channel, the direction of the channel within the crystallographic orientation, and the direction of the applied stress. Manipulating stress is an effective way of improving the minority carrier mobility in a MOSFET and increasing the transconductance (or reduced serial resistance) of the MOSFET that requires relatively small modifications to semiconductor processing while providing significant enhancement to MOSFET performance.

The effect of uniaxial stress, i.e., a stress applied along one crystallographic direction, on the performance of semiconductor devices, especially on the performance of MOSFET (or a "FET" in short) devices built on a silicon substrate, has been extensively studied in the semiconductor industry. For a PMOSFET (or a "PFET" in short) utilizing a silicon channel, the mobility of minority carriers in the channel (which are holes in this case) increases under uniaxial compressive stress along the direction of the channel, i.e., the direction of the movement of holes or the direction connecting the drain to the source. Conversely, for an NMOSFET (or an "NFET" in short) devices utilizing a silicon channel, the mobility of minority carriers in the channel (which are electrons in this case) increases under uniaxial tensile stress along the direction of the channel, i.e., the direction of the movement of electrons or the direction connecting the drain to the source. These opposite requirements for the type of stress for enhancing carrier mobility between the PMOSFETs and NMOSFETs have led to prior art methods for applying at least two different types of stress to the semiconductor devices on the same integrated chip.

Different methods of "stress engineering," or "strain engineering" as it is alternatively called, on the channel of a MOSFET have been known in the prior art. One group of methods creates a "global stress," that is, a stress applied to a general transistor device region generated from the substrate. A global stress is generated by such structures as SiGe stress relaxed buffer layers, Si:C stress relaxed buffer layers, or silicon germanium structures on an insulator.

Another group of methods generates a "local stress," that is, a stress applied only to local areas adjacent to the channel from a local structure. A local stress is generated by such structures as stress liners, embedded SiGe source/drain structures, embedded Si:C source/drain structures, stress-generating shallow trench isolation structures, and stress-generating silicides. An increase in the on-current of up to 50% and an overall chip speed increase up to 40% have been reported on semiconductor devices utilizing these methods.

One of the most common methods of applying a local stress is the use of stress liners. Since each stress liner has a certain stress level either compressive or tensile, two separate stress liners, commonly called "dual stress liners," are used to separately create a tensile stress and a compressive stress in two different regions of the same integrated circuit. An exemplary method for forming two separate liners is disclosed in U.S. Patent Application Publication No. 2005/0093030 A1 to Doris et al., which discloses the use of two separate liners such that an NFET area is covered with a tensile liner that directly overlies underlying NFETs, an optional dielectric layer, and a compressive liner while a PFET area is covered only with the compressive liner, The liner stack over the NFET area applies tensile stress to the underlying NFETs and the compressive liner over the PFET area applies compressive stress to the underlying PFETs so that both PFETs and NFETs have enhanced performance through stress engineering.

Figure 1:
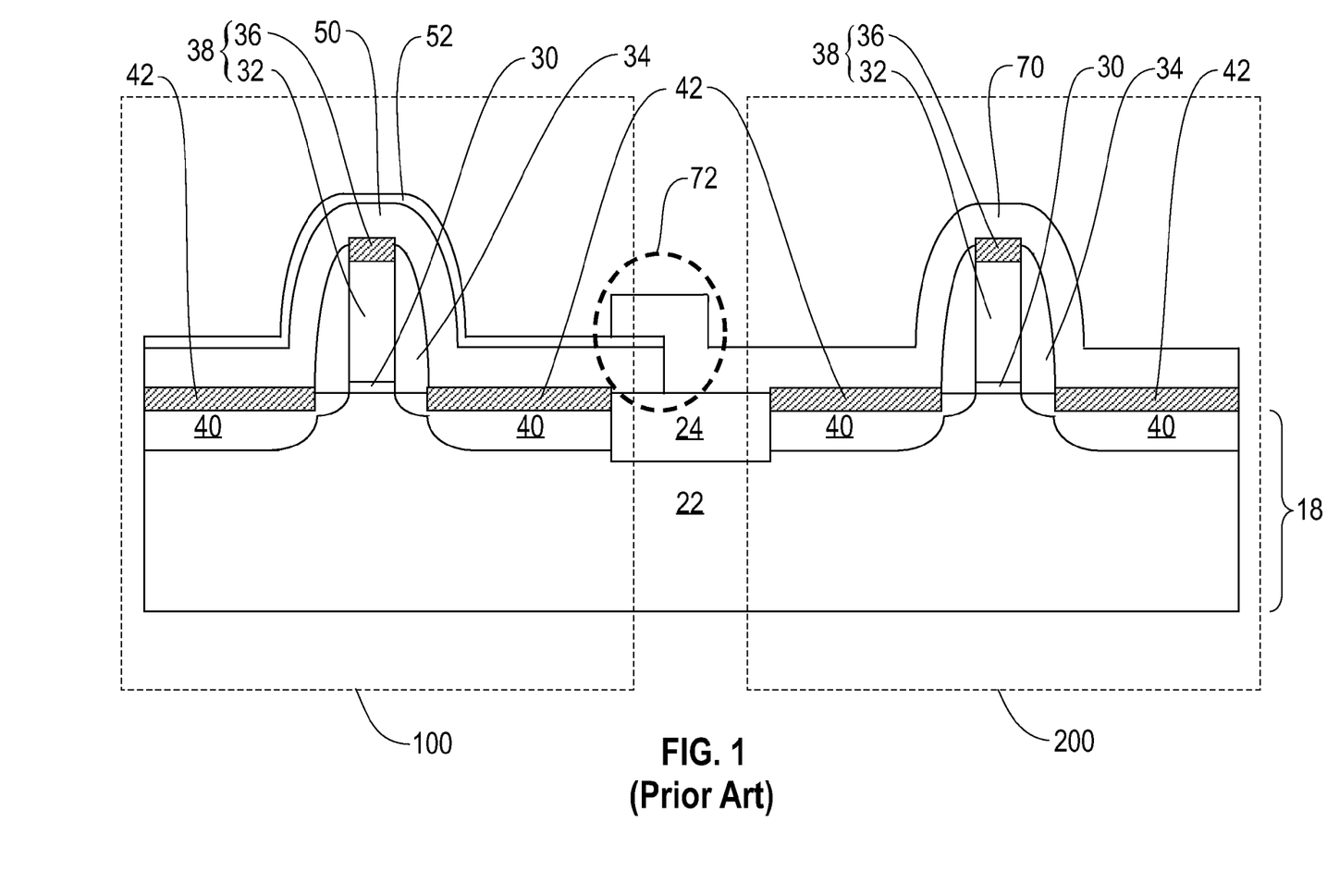
FIG. 1 is a vertical cross-sectional view of a prior art structure containing a first MOSFET 100 and a second MOSFET 200 of opposite conductivity types and dual stress liners.

Referring to FIG. 1, an exemplary dual stress liner structure according to the prior art is shown. A first MOSFET 100 of one conductivity type and a second MOSFET 200 of the opposite conductivity type, i.e., a pair of a p-type MOSFET and an n-type MOSFET, are formed on a semiconductor substrate 18. The first MOSFET 100 comprises a portion of the substrate layer 22, a gate dielectric 30, a gate conductor 38 which comprises a gate polysilicon 32 and a gate silicide 36, a spacer 34, source and drain regions 40, a source and drain silicide 42, a first stress liner 50, and an etch stop layer 52. Similarly, the second MOSFET 200 comprises another portion of the substrate 22, a gate dielectric 30, a gate conductor 38 which comprises a gate polysilicon 32 and a gate silicide 36, a spacer 34, source and drain regions 40, a source and drain silicide 42, and a second stress liner 70. Shallow trench isolation (STI) 24 provides electrical isolation between the first MOSFET 100 and the second MOSFET 200. Typically, boundary region 72 between the first stress liner 50 and the second stress liner 70 comprises a region where first and second stress liners overlap, However, alternative boundary region geometries are possible. For example, boundary region 72 might comprise a small gap between first and second stress liners instead of an overlap region.

The first stress liner 50 applies a first stress to the first MOSFET 100 and the second stress liner 70 applies a second stress to the second MOSFET 200. The first stress and the second stress are different, and typically, the two stresses are opposite in nature, i.e., one is compressive and the other is tensile. Further, the substrate is typically a silicon substrate and a compressive stress is applied to a p-type MOSFET (PMOSFET, or a "PFET") and a tensile stress is applied to an n-type MOSFET (NMOSFET, or an "NFET"). The first MOSFET 100 may be a PMOSFET with a compressive stress or an NMOSFET with a tensile stress depending on the method of fabrication. A MOSFET of the opposite polarity with the opposite type of stress is selected for the second MOSFET 200 relative to the first MOSFET 100.

The effect of a stress on conductivity of a material is called the "piezoresistance effect." Semiconductor materials typically display a piezoresistive effect since the stress induces strain, which in turn changes the band structure of the semiconductor material. The piezoresistance effect depends on the semiconductor material, doping type of the semiconductor materal, direction of the current flow relative to the crystallographic axes of the semiconductor material, direction and magnitude of the applied stress, and the temperature of the semiconductor material. Quantitative analysis of the piezoresistance effect on silicon is disclosed in Y. Kanda, "A Graphical Representation of the Piezoresistance Coefficients in Silicon," IEEE Transactions on Electron Devices, Vol. ED-29, pp. 64-70, No. 1, Jan. (1982), which is herein incorporated by reference.

Piezoresistive coefficients are defined as a fractional change in the resistance of a semiconductor material per unit pressure. A longitudinal piezoresistive coefficient is a measure of fractional change in the resistance per applied tensile stress in the direction of current flow (i.e., in the direction of the channel, in the case of field effect transistors). A transverse piezoresistive coefficient is a measure of fractional change in the resistance per applied tensile stress in the direction perpendicular to the current flow and within the plane of the channel (i.e., in the direction of the gate line, in the case of field effect transistors). While estimation of piezoresistive coefficients $\pi$ in a PFET in the on-state is difficult since holes are predominant charge carriers in the inversion layer comprising n-doped silicon instead of electrons, the piezoresistive coefficients $\pi$ may be estimated from p-doped silicon which contains holes as charge carriers in a normal state, i.e., in the absence of an inversion condition. Positive correlation between piezoresistive coefficients of an inversion layer formed in an n-doped silicon layer and piezoresistive coefficients of a p-doped silicon layer in a normal state is known. Similar correlation holds between piezoresistive coefficients of an inversion layer formed in a p-doped silicon layer and piezoresistive coefficients of an n-doped silicon layer in a normal state.

Figure 2:
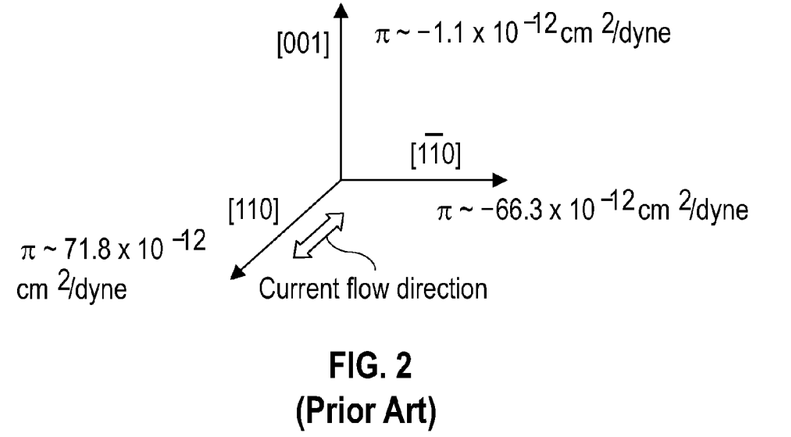
FIG. 2 is a diagram showing a typical orientation of a p-type field effect transistor (PFET) formed in a silicon layer having a (001) surface orientation is shown.

Typical silicon-based semiconductor devices employ a substrate containing a silicon layer having a (001) surface orientation. Referring to FIG. 2, a typical orientation of a p-type field effect transistor (PFET) formed in a silicon layer having a (001) surface orientation is shown, in which the current flow direction, i.e., the direction of a channel, is along the [110] crystallographic direction, and the direction of a gate line is along the [1 $\bar{1}$ 0] crystallographic direction. The longitudinal piezoelectric coefficient, as estimated from an equivalent p-doped silicon layer, is on the order of $71.8 \times 10^{-12}$ cm$^2$/dyne and the lateral transverse piezoelectric coefficient estimated in the same manner is on the order of $-66.3 \times 10^{-12}$ cm$^2$/dyne. Thus, the resistivity of the channel containing n-doped silicon in an inversion state during the on-state of the PFET increases under a longitudinal tensile stress and decreases under a lateral transverse tensile stress. To enhance conductivity of the channel, and consequently the on-current of the PFET, a longitudinal compressive stress and/or a transverse tensile stress is required on the PFET.

While prior art structures advantageously employ piezoresistive effects of silicon to enhance performance of field effect transistors, there exists a need for semiconductor structures that can enhance performance of complementary metal oxide semiconductor (CMOS) transistors on a silicon substrate even further. In particular, a PFET structure that provides enhanced performance through constructive manipulation of piezoresistive effects is desired for high performance CMOS circuits.

Further, when multiple stress-generating structures are formed on a semiconductor substrate, the performance of a particular semiconductor device is affected by primary stress effects from stress-generating structures in the particular semiconductor device itself, as well as by secondary stress effects from stress-generating structures in adjacent devices. Therefore, there exists a need for a semiconductor structure that may advantageously employ secondary stress effects from neighboring semiconductor devices.

SUMMARY OF THE INVENTION

The present invention addresses the needs described above by providing structures in which a PFET located on a (110) silicon substrate has a channel orientation (specified by an azimuthal angle relative to an in-plane [1 $\bar{1}$ 0] crystallographic direction) such that the conductivity of an inversion layer in a channel increases with compressive longitudinal strain and tensile transverse strain.

In the present invention, a PFET is formed on a silicon layer having a (110) surface orientation and located in a substrate. A compressive stress liner is formed on the PFET gate and PFET source/drain regions thereby generating a primary compressive longitudinal strain in the PFET channel. A tensile stress liner is formed on at least one NFET located adjacent to the PFET. The tensile stress liner generates a tensile longitudinal strain in the NFET channel. The same tensile stress liner also introduces a secondary tensile stress on the channel of the adjacent PFET, a stress that will be transverse to the PFET gate when the at least one NFET is transversely adjacent to the PFET and longitudinal to the PFET gate when the at least one NFET is longitudinally adjacent to the PFET. The PFET channel orientation is selected so as to optimize the net benefit of the primary and secondary strain fields. The azimuthal angle of the PFET channel (defined as the angle between the direction current flow in the PFET channel and the in-plane direction of a [1 $\bar{1}$ 0] crystallographic direction in the (110) silicon layer) for which the net benefit is optimized typically falls in the range from about 0° to about 55°, with angles in the range from about 25° to about 55°, being preferable. More sophisticated calculations indicate that PFET channel directions in the range 25° to 55° are particularly preferable under conditions of high longitudinal compressive stress (e.g., above 1-2 GPa) since channels having these directions show less saturation in their mobility vs. stress curves.

Secondary tensile stresses are most beneficial to neighboring PFETs when secondary longitudinal tensile stresses are minimized and secondary transverse tensile stresses are maximized. The effects of these secondary stresses generally increase as FET dimensions and PFET-to-NFET spacings shrink. Maximum advantage is thus obtained when longitudinally adjacent NFETs become further away from the PFET and when transversely adjacent NFETs become closer to the PFET, the latter situation naturally occurring as the long dimension of the PFET gate line (i.e., the one perpendicular to current flow) decreases. Typically, center-to-center spacings of adjacent PFETs and NFETs for the devices of this invention would be in the range 0.5 to 3 μm, with the most typical spacings averaging around 1 μm.

In the present invention, the physical directions of the gate line of the PFET and the gate line of the at least one NFET are the same. Longitudinal tensile channel strain in the at least one NFET typically increases the conductivity of an inversion layer of the at least one NFET. The at least one NFET may be formed on the same (110) silicon substrate, or preferably, formed on another silicon layer having a (001) surface orientation.

According to the present invention, a semiconductor structure is provided, which comprises:

a substrate containing a first silicon layer having a (110) surface orientation;

a p-type field effect transistor (PFET) located on the first silicon layer and containing a PFET channel between a PFET source region and a PFET drain region, wherein an azimuthal angle between a direction of current flow in the PFET channel and an in-plane [1 $\bar{1}$ 0] crystallographic direction in the first silicon layer is from about 25° to about 55°;

a PFET gate line located over the PFET channel;

a compressive stress liner located on the PFET gate line, a PFET source region, and a PFET drain region, wherein the compressive stress liner produces a compressive longitudinal strain in the PFET channel;

a second silicon layer having a (001) surface orientation;

an n-type field effect transistor (NFET) located on the second silicon layer and containing an NFET channel, an NFET source region, and an NFET drain region;

an NFET gate line located over the NFET channel; and a tensile stress liner located on the NFET gate line, the NFET source region, and the NFET drain region, wherein the tensile stress liner produces a tensile longitudinal strain in the NFET channel and a secondary tensile transverse stress in the PFET channel.

In one embodiment, the PFET gate line and the NFET gate line have a same lengthwise direction.

In another embodiment, the NFET gate line is aligned with an in-plane [110] crystallographic direction in the second silicon layer.

In even another embodiment, the azimuthal angle is in a range from about 25° to an angle between the [1 $\bar{1}$ 0] crystallographic direction and an in-plane [1 $\bar{1}$ 1] crystallographic direction in the first silicon layer.

In yet another embodiment, the semiconductor structure of claim 1, wherein the azimuthal angle is in a range from an angle between the [1 $\bar{1}$ 0] crystallographic direction and an in-plane [1 $\bar{1}$ 1] crystallographic direction to about 55°.

In still another embodiment, the direction of current flow in the PFET channel is substantially along a [1 $\bar{1}$ $\sqrt{2}$] crystallographic direction and the azimuthal angle is substantially 45°.

In still yet another embodiment, the substrate is a hybrid orientation substrate containing a bulk portion and a semiconductor-on-insulator (SOI) portion.

In a further embodiment, the bulk portion contains the first silicon layer and the SOI portion contains the second silicon layer.

In an even further embodiment, the bulk portion contains the second silicon layer and the SOI portion contains the first silicon layer.

In a yet further embodiment, the substrate is a hybrid orientation substrate containing a bulk portion and a direct-silicon-bonded (DSB) portion.

In a still further embodiment, the semiconductor structure further comprises a boundary between the tensile stress liner and the compressive stress liner, the boundary separated transversely from edges of the PFET source region and the PFET drain region by less than 0.3 µm and separated longitudinally from a center line along a lengthwise direction of the PFET gate line by at least 0.3 µm.

In even another embodiment, the semiconductor structure further comprises;

at least another n-type field effect transistor (NFET) located on the second silicon layer and containing at least another NFET channel, at least another NFET source region, and at least another NFET drain region;

at least another NFET gate line located over each of the at least another NFET channel, wherein the tensile stress liner is located on the at least another NFET gate line, the at least another NFET source region, and the at least another NFET drain region, and wherein the tensile stress liner produces a tensile longitudinal strain in each of the at least one NFET channel.

According to another aspect of the present invention, another semiconductor structure is provided which comprises:

a substrate containing a silicon layer having a (110) surface orientation;

a p-type field effect transistor (PFET) located on the silicon layer and containing a PFET channel between a PFET source region and a PFET drain region, wherein an azimuthal angle between a direction of current flow in the PFET channel and a [1 $\bar{1}$ 0] crystallographic direction is from about 25° to about 55°;

a PFET gate line located over the PFET channel;

a compressive stress liner located on the PFET gate line, the PFET source region, and the PFET drain region, wherein the compressive liner applies a compressive longitudinal strain to the PFET channel;

an n-type field effect transistor (NFET) located on the silicon layer, the NFET containing an NFET channel between an NFET source region and an NFET drain region, wherein an angle between a direction of current flow in the NFET channel and a [1 $\bar{1}$ 0] crystallographic direction is from about 25° to about 55°;

a NFET gate line located over the NFET; and a tensile stress liner located on the NFET gate line, the NFET source region, and the NFET drain region, wherein the tensile stress liner applies a primary compressive longitudinal strain to the NFET channel and a secondary tensile transverse stress to the PFET channel.

In one embodiment, the PFET gate line and the at least one NFET gate line have a same lengthwise direction.

In another embodiment, the azimuthal angle is in a range from about 25° to an angle between the [1 $\bar{1}$ 0] crystallographic direction and an in-plane [1 $\bar{1}$ 1] crystallographic direction.

In even another embodiment, the azimuthal angle is in a range from an angle between the [1 $\bar{1}$ 0] crystallographic direction and an in-plane [1 $\bar{1}$ 1] crystallographic direction and about 55°.

In yet another embodiment, the direction of current flow in the channel is substantially along an in-plane [1 $\bar{1}$ $\sqrt{2}$] crystallographic direction and the azimuthal angle is substantially 45°.

In still another embodiment, the substrate is a bulk substrate.

In still yet another embodiment, the semiconductor structure further comprises shallow trench isolation, wherein the PFET and the NFET are separated by the shallow trench isolation and the compressive stress liner and the tensile stress liner overlap on the shallow trench isolation.

In a further embodiment, the semiconductor structure further comprises:

at least another n-type field effect transistor (NFET) located on the silicon layer and containing at least another NFET channel, at least another NFET source region, and at least another NFET drain region;

at least another NFET gate line located over each of the at least another NFET channel, wherein the tensile stress liner is located on the at least another NFET gate line, the at least another NFET source region, and the at least another NFET drain region, and wherein the tensile stress liner produces a tensile longitudinal strain in each of the at least one NFET channel.

In an even further embodiment, the semiconductor structure further comprises a boundary between the tensile stress liner and the compressive stress liner, the boundary separated transversely from edges of the PFET source region and the PFET drain region by less than 0.3 μm and separated longitudinally from a center line along a lengthwise direction of the PFET gate line by at least 0.3 μm.

DETAILED DESCRIPTION OF THE INVENTION

As stated above, the present invention relates to complementary metal oxide semiconductor (CMOS) transistors with enhanced mobility through biaxial stress generated by dual stress liners, which are now described in detail with accompanying figures. It is noted that like and corresponding elements are referred to by like reference numerals.

It is understood that due to inherent symmetry in the crystallographic structure of silicon, the (001) surface orientation may be considered a (100) surface orientation, a (010) surface orientation, a (00$\bar{1}$) surface orientation, etc. in alternate coordinate systems. Likewise, a (110) surface orientation may be considered an (1$\bar{1}$0) orientation, etc. Such equivalency is implied herein even when not explicitly stated. Further, it is also understood that when different equivalent surface orientations or crystallographic directions are distinguished, for example, between a [110] crystallographic direction and a [1$\bar{1}$0] crystallographic direction, any change to one crystallographic direction due to use of an alternate coordinate system must be accompanied by an equivalent change in other surface or crystallographic directions so that all crystallographic and surface orientations employ the same coordinate system.

Figure 3:
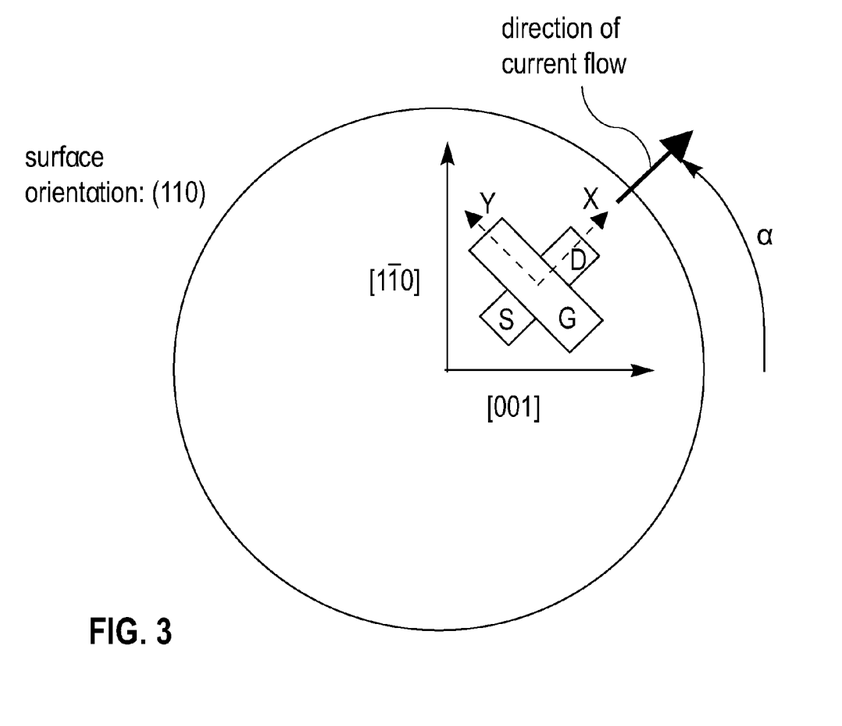
FIG. 3 is a diagram showing orientations of components of a p-type field effect transistor (PFET) according to the present invention.

Referring to FIG. 3, a diagram schematically shows relative orientations of components of a semiconductor structure according to the present invention. A p-type field effect transistor (PFET) comprising a source S, a drain D, and a gate line G is formed on a silicon substrate having a (110) surface orientation. The plane of the surface of the silicon substrate contains two orthogonal crystallographic directions. In the description of the present invention, an in-plane [001] crystallographic direction and an in-plane [1$\bar{1}$0] crystallographic direction in (110) silicon are used as two orthogonal crystallographic directions. The direction of current flow in the PFET is herein referred to an X-axis. The X-axis is along the direction connecting the source S to the drain D. Since the current flows in a channel of the PFET, the direction of the current flow is also referred to the direction of the channel. The gate liner G typically has a rectangular horizontal cross-sectional area and is longer in the direction perpendicular to the X-axis than along the X-axis. The lengthwise direction, which is perpendicular to the X-axis and contained in the plane of the surface of the silicon substrate, is herein referred to as a Y-axis. The direction of surface normal of the surface of the silicon substrate is herein referred to as Z-axis (not shown in FIG. 3).

The X-axis is rotated from the [001] crystallographic direction by an azimuthal angle of α about the Z-axis, which is the surface normal of the silicon substrate having the (110) surface orientation, and consequently, corresponds to a [110] crystallographic direction of the silicon crystal in the silicon substrate. The rotation of the X-axis about the [110] crystallographic direction may be counterclockwise or clockwise, i.e., may be toward the [1$\bar{1}$0] crystallographic direction or toward the [$\bar{1}$10] crystallographic direction of the (110) silicon substrate. The azimuthal angle of α about the Z-axis is from about from about 25° to about 55°. The range of the azimuthal angle of α is selected to optimize the net benefit to the channel of the PFET, or a "PFET channel," from primary and secondary strain fields, as described below.

Biaxial stress herein denotes concurrent application of a longitudinal stress and a transverse stress in the plane of the surface of the silicon substrate. The longitudinal stress refers to a stress applied along the direction of the channel, which is the direction of the current flow, and the same as the X-axis in the coordinate system used herein. The transverse stress refers to a stress applied along the lengthwise direction of the gate line G, which is perpendicular to the direction of the current flow, and the same as the Y-axis in the coordinate system used herein. The direction of the longitudinal stress and the direction of the transverse stress are perpendicular to the surface normal, which is the [110] crystallographic direction of the silicon substrate.

The dimension of the gate line G along the lengthwise direction, i.e., the direction of the longer side of the rectangle in a horizontal cross-sectional view that is the same as the Y-axis in the coordinate system used herein, is typically more than 6 times the dimension of the gate line G along the direction of the current flow, i.e., the direction of the channel that is the same as the X-axis in the coordinate system used herein. A compressive stress liner deposited over gate line G and source and drain regions S and D generates a compressive longitudinal stress on the PFET channel thereby inducing a compressive longitudinal strain in the PFET channel.

While the prior art focus on beneficial effects of a longitudinal uniaxial stress along the direction of current flow (i.e., along the direction of the channel), on carrier mobility in the PFET channel, the present invention advantageously employs both a primary compressive longitudinal stress (imparted by an overlying compressive liner) and a secondary tensile transverse stress (imparted by tensile liners on transversely adjacent NFETs).

Figure 4:
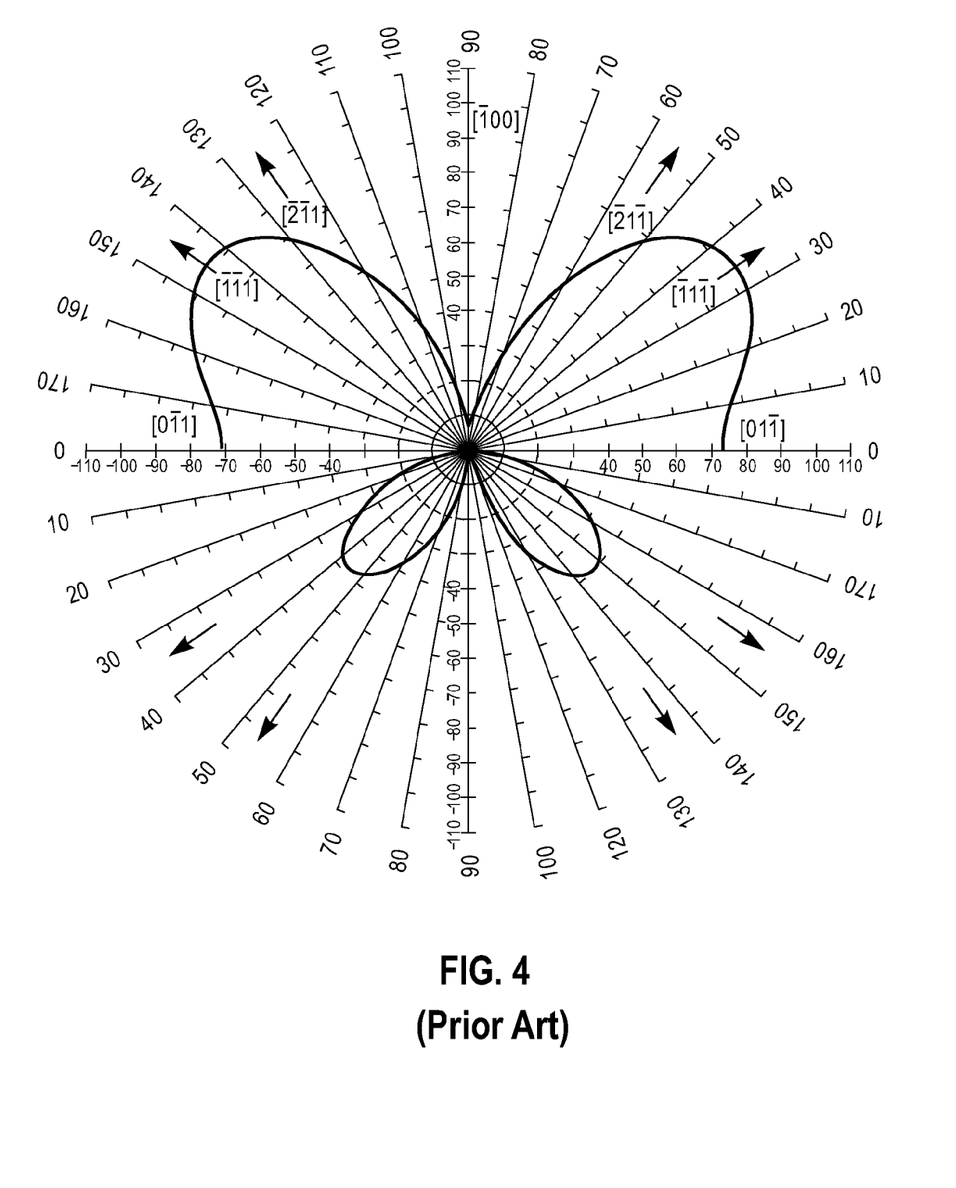
FIG. 4 is a radial plot of orientation dependent piezoresistive coefficients in a p-doped silicon layer having a (011) surface orientation as disclosed by Y. Kanda, Ibid.

The selection of the range of the azimuthal angle of a about the Z-axis is based on simultaneous utilization of the primary compressive longitudinal stress and a secondary tensile transverse stress. FIG. 4 shows a graph of piezoresistive coefficients from Y. Kanda, Ibid. The upper half of the graph shows a radial plot of the longitudinal piezoresistive coefficient along various crystallographic directions in a surface plane of a p-doped silicon having a (011) surface orientation. The lower half of the graph shows a radial plot of the magnitude of the transverse piezoresistive coefficient along various crystallographic directions in the surface plane of the p-doped silicon having the (011) surface. The transverse piezoresistive coefficient is negative within the plane of the (011) surface orientation, i.e., in the plane perpendicular to the [011] crystallographic direction. Thus, a tensile transverse stress decreases the resistivity of the p-doped silicon, or an increase in conductivity of the p-doped silicon.

Further, the present invention advantageously utilizes the similarity of piezoresistive characteristics of n-doped silicon under inversion to piezoresistive characteristics of p-doped silicon. Thus, the direction of the current flow in the PFET channel, i.e., the direction of the X-axis, and the lengthwise direction of the gate line G (See FIG. 3), i.e., the direction of the Y-axis, are selected such that the longitudinal piezoresistive coefficient is close to a maximal value in the direction of the current flow in the PFET channel and the magnitude of the transverse piezoresistive coefficient is also close to a maximal value in the direction of the lengthwise direction of the gate line G. A constraint that the angle between the direction of the current flow in the PFET channel and the lengthwise direction of the gate line G is orthogonal is imposed in the selection of a pair of crystallographic axes for the X-axis and the Y-axis among the crystallographic directions in the plane of the (011) surface orientation. Both compressive longitudinal stress and tensile transverse stress can make significant contributions to decreasing the resistivity of an inversion layer of the PFET channel comprising n-doped silicon, thereby increasing the on-current of the PFET.

The longitudinal piezoresistive coefficient within the plane of (011) surface orientation exceeds $75.0 \times 10^{-12}$ cm$^2$/dyne for the range of a first angle between the X-axis and the $[01\bar{1}]$ axis when the first angle is in the range from about 10° to about 55°. The magnitude of the transverse piezoresistive coefficient within the plane of (011) surface orientation exceeds $30.0 \times 10^{-12}$ cm$^2$/dyne for the range of a second angle between the Y-axis and a [100] axis when the second angle is in the range from about 25° to about 65°. Thus, the range of preferred values of the azimuthal angle α about the Z-axis in FIG. 3 is from the overlapping range from about 25° to about 55°.

Further, the longitudinal piezoresistive coefficient within the plane of (011) surface orientation exceeds $85.0 \times 10^{-12}$ cm$^2$/dyne for the range of a first angle between the X-axis and the $[01\bar{1}]$ axis when the first angle is in the range from about 21° to about 48°. The magnitude of the transverse piezoresistive coefficient within the plane of (011) surface orientation exceeds $48.0 \times 10^{-12}$ cm$^2$/dyne for the range of a second angle between the Y-axis and a [100] axis when the second angle is in the range from about 40° to about 50°. Thus, the range of more preferred values of the azimuthal angle α about the Z-axis in FIG. 3 is from the overlapping range from about 40° to about 50°.

It is recognized that alignment of two crystallographic structures is facilitated if symmetry is present. For this reason, the azimuthal angle α about the Z-axis may substantially be 45°. In this case, the X-axis is in the direction of a $[1\bar{1}\sqrt{2}]$ crystallographic direction.

Figure 5:
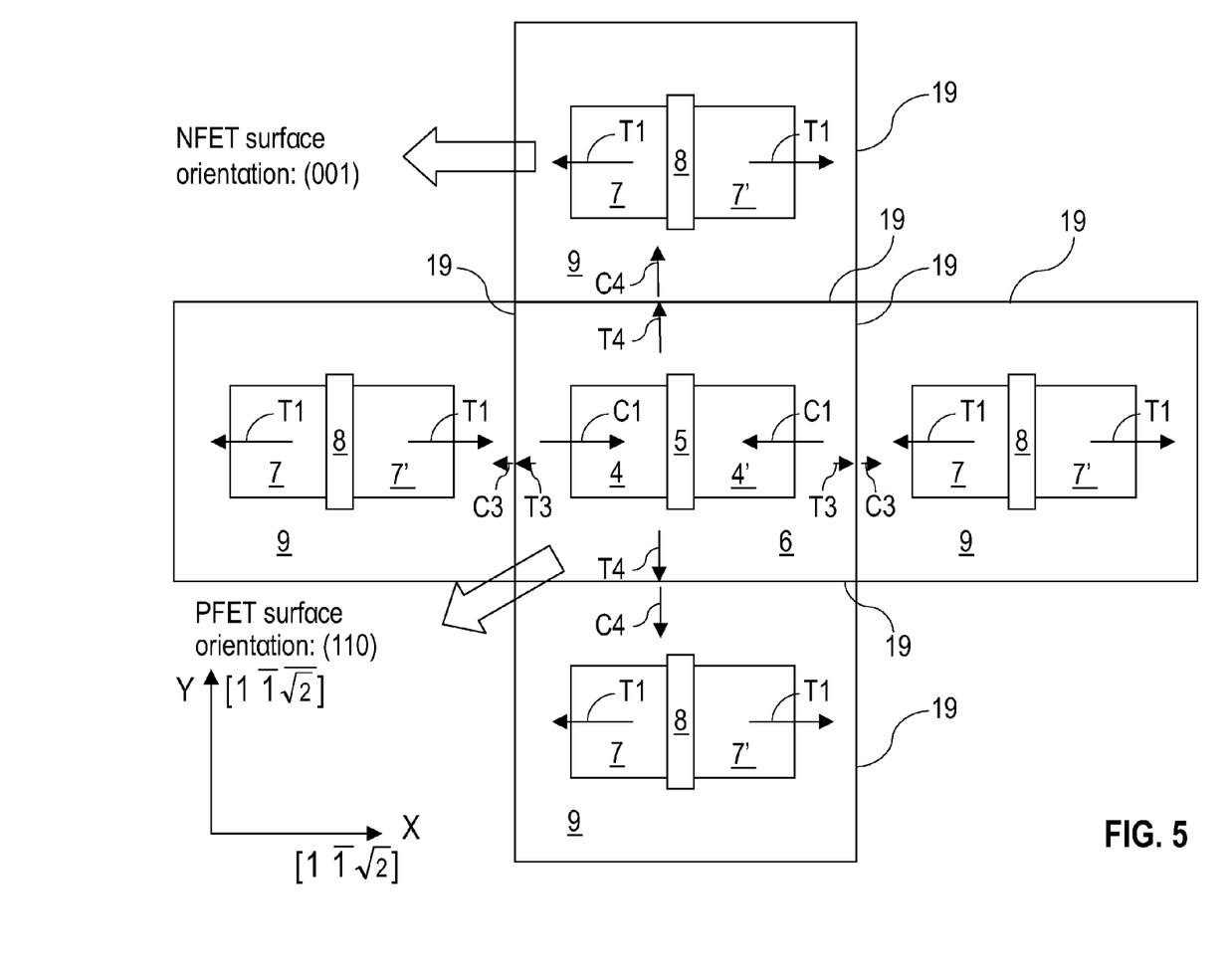
FIGS. 5-8 are top-down view layouts of first through fourth exemplary semiconductor structures including diagrams for surface orientations and crystallographic directions thereof and symbols for various stress components therein, respectively.

Referring to FIG. 5, a top-down view layout of a first exemplary semiconductor structure is shown. The top-down view layout includes diagrams for surface orientations and crystallographic directions of the components of the first exemplary semiconductor structure as well as symbols for various stress components in the first exemplary semiconductor structure.

The first exemplary semiconductor structure comprises a PFET containing a PFET source region 4, a PFET drain region 4', a PFET gate line 5, and a first shallow trench isolation portion 6. The PFET is formed on a first silicon layer (not shown) having a (110) surface orientation. The crystallographic directions of the first silicon layer are selected such that an azimuthal angle α (not shown) between a direction of current flow in a PFET channel and a $[1\bar{1}0]$ crystallographic direction is substantially 45°. The crystallographic direction corresponding to the direction of the current flow in the PFET is substantially a $[1\bar{1}\sqrt{2}]$ crystallographic direction. Since the PFET gate line 5 is perpendicular to the direction of the current flow in the PFET, the crystallographic direction corresponding to a lengthwise direction of the PFET gate line 5 is substantially a $[1\bar{1}\sqrt{2}]$ crystallographic direction.

A compressive stress liner (not shown) covers the area enclosed by a liner boundary 19 and containing the PFET source region 4, the PFET drain region 4', the PFET gate line 5, and the first shallow trench isolation portion 6. The compressive stress liner applies a primary compressive longitudinal stress C1 to a PFET channel (not shown) located beneath the PFET gate line 5 and between the source region 4 and the drain region 4' in the direction of the PFET channel, i.e., in the direction of the current flow in the PFET. The primary compressive longitudinal stress C1 is applied in the direction connecting the source region 4 and the drain region 4'. A primary stress herein refers to a stress generated by a stress liner located directly on the transistor of which the channel stress is applied to. The direction of each of the arrows in FIG. 5 refers to the direction of the stress that each of the arrows symbolizes.

The first exemplary semiconductor structure further comprises at least one NFET, wherein each of the at least one NFET contains an NFET source region 7, an NFET drain region 7', an NFET gate line 8, and a second shallow trench isolation portion 9. The at least one NFET is formed on a second silicon layer (not shown) having a (001) surface orientation. Gate line(s) 8 of the at least one NFET are parallel to PFET gate line 5. The crystallographic directions of the second silicon layer would typically be selected such that a direction of current flow in each of NFET channel(s) in the at least one NFET is along an in-plane [110] crystallographic direction of the (001) silicon layer. However the NFET channel orientation with respect to the in-plane crystallographic directions of the (001) silicon layer is not critical since the benefits of longitudinal tensile strain for NFETs in (001) silicon are relatively insensitive to channel direction.

A tensile stress liner (not shown) covers the area enclosed by the liner boundary 19 and containing the at least one NFET source region 7, the at least one NFET drain region 7', the at least one NFET gate line 8, and the second shallow trench isolation portion 9. The tensile stress liner applies a primary tensile longitudinal stress T1 to at least one NFET channel (not shown), each of which is located beneath one of the at least one NFET gate line 8 and between one of the at least one NFET source region 7 and one of the at least one drain region 7'. The primary tensile longitudinal stress T1 is applied in the direction of the at least one NFET channel, i.e., in the direction of the current flow in the at least one NFET which is also the direction connecting a pair of an NFET source region 7 and an NFET drain region 7' in one of the at least one NFET.

According to the present invention, secondary transverse tensile stresses T4 are beneficially introduced to the PFET channel by the tensile stress liners on transversely adjacent NFETs. Undesirable secondary longitudinal tensile stresses T3 are also introduced to the PFET channel by the tensile stress liners on longitudinally adjacent NFETs.

The PFET and each of the at least one NFET have the same current flow direction (provided that directions 180 degrees apart are considered to be the same), and the lengthwise directions of the PFET gate line 5 and the at least one NFET gate line 8 are the same.

Figure 6:
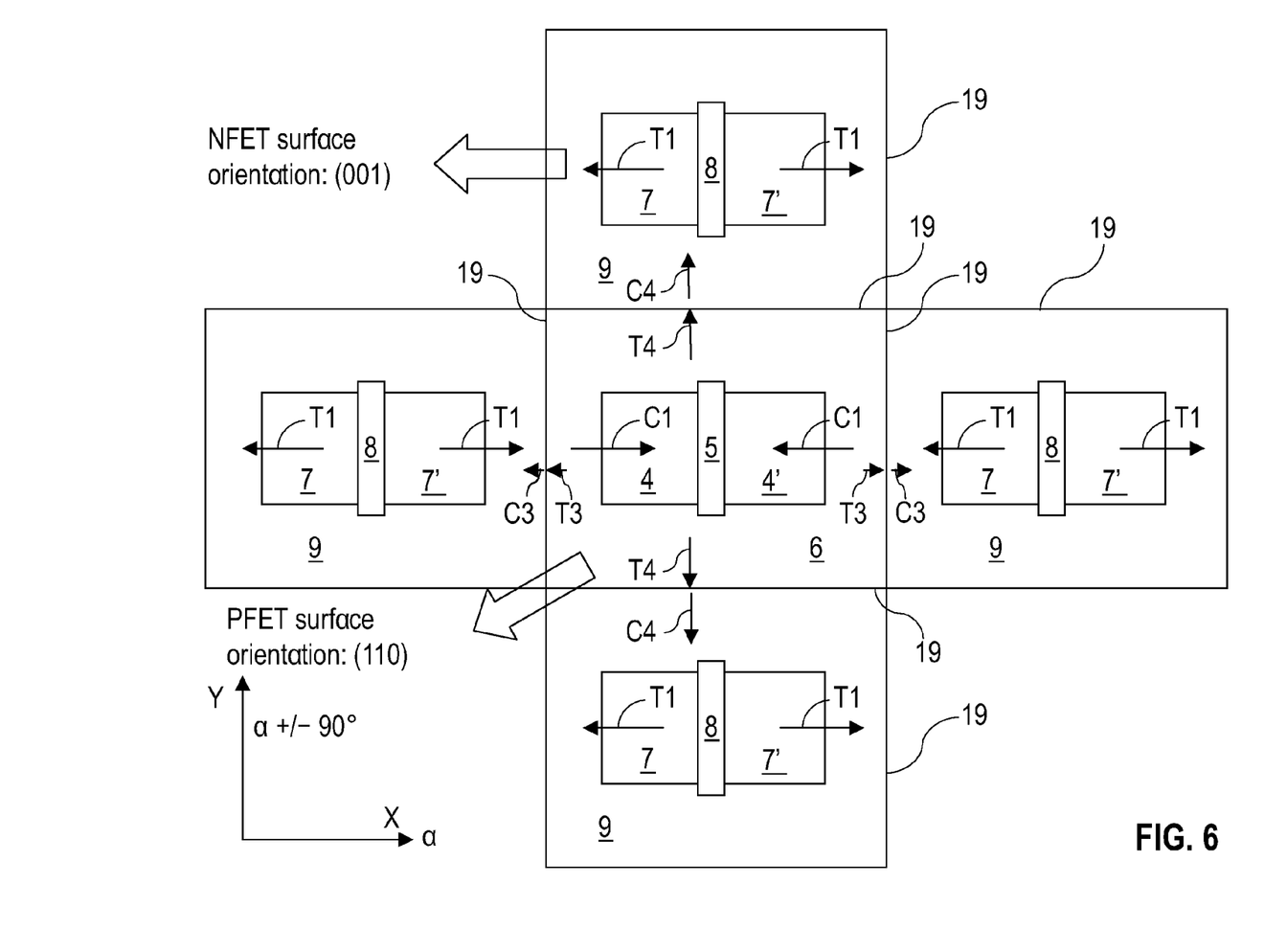

Referring to FIG. 6, a second exemplary semiconductor structure comprises a PFET and at least one NFET and stress liners in the same arrangement as in the first exemplary semiconductor structure. However, the crystallographic orientation of the first silicon layer may be altered. Specifically, the crystallographic orientation of the first silicon layer is selected such that an azimuthal angle α (not shown) between a direction of current flow in a PFET channel and an in-plane [1 $\bar{1}$ 0] crystallographic direction in the (110) silicon layer is from about 25° to about 55°. The crystallographic direction corresponding to the direction of the current flow in the PFET is located in the plane of (110) surface orientation and contains the [1 $\bar{1}$ $\sqrt{2}$] crystallographic direction, which is employed in the first exemplary semiconductor structure. The plane of (110) surface orientation also contains a [1 $\bar{1}$ 1] crystallographic direction, which is one of major crystallographic directions. The azimuthal angle α may be less than, the same as, or greater than the angle between the [1 $\bar{1}$ 0] crystallographic direction and the [1 $\bar{1}$ 1] crystallographic direction, which is the arccosine of $2/\sqrt{6}$, or approximately 35.26°. In one case, the azimuthal angle α may substantially be 45° as in the first embodiment.

Since the PFET gate line 5 is perpendicular to the direction of the current flow in the PFET, the angle between a lengthwise direction of the PFET gate line 5 and the in-plane [1 $\bar{1}$ 0] crystallographic direction is substantially α+/−90°. The relationship among the crystallographic directions of the second silicon layer, the direction of current flow in each of NFET channel(s) in the at least one NFET, and the lengthwise direction of each of the at least one NFET gate line(s) 8 is the same as in the first exemplary semiconductor structure. The advantageous effects of various stresses generated by the compressive stress liner over the PFET and the tensile stress liner over the at least one NFET on enhancement of performance of the PFET and the at least one NFET are the same as in the first exemplary semiconductor structure.

Figure 7:
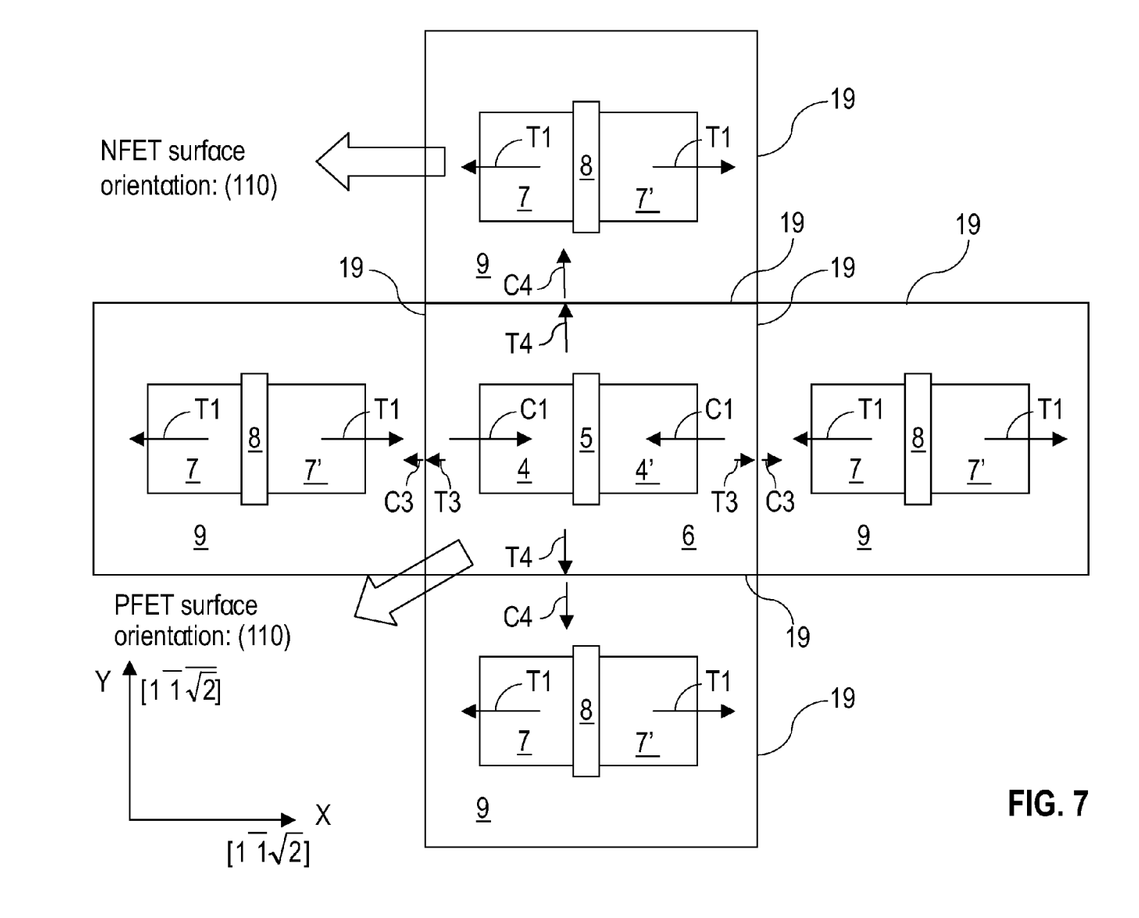

Referring to FIG. 7, a third exemplary semiconductor structure comprises a PFET and at least one NFET and stress liners in the same arrangement as in the first exemplary semiconductor structure. However, a silicon layer having the same crystallographic orientation throughout is employed for the first silicon layer and the second silicon layer, i.e., the first silicon layer and the second silicon layer are one and the same. The relationship among the crystallographic directions of the silicon layer, the direction of current flow in the PFET channel, and the lengthwise direction of the PFET gate line 5 is the same as the relationship among the crystallographic directions of the first silicon layer, the direction of current flow in the PFET channel, and the lengthwise direction of the PFET gate line 5 in the first exemplary semiconductor structure. Specifically, the silicon layer has a (110) surface orientation, the crystallographic direction corresponding to the direction of the current flow in the PFET is substantially a [1 $\bar{1}$ $\sqrt{2}$] crystallographic direction, and the crystallographic direction corresponding to a lengthwise direction of the PFET gate line 5 is substantially a [1 $\bar{1}$ $\sqrt{2}$] crystallographic direction. Further, the crystallographic direction corresponding to the direction of the current flow in the at least one NFET is substantially a [1 $\bar{1}$ $\sqrt{2}$] crystallographic direction, and the crystallographic direction corresponding to a lengthwise direction of the at least one NFET gate line 8 is substantially a [1 $\bar{1}$ $\sqrt{2}$] crystallographic direction. The advantageous effects of various stresses generated by the compressive stress liner over the PFET and the tensile stress liner over the at least one NFET on enhancement of performance of the PFET are the same as in the first exemplary semiconductor structure. However NFET performance is much worse on a silicon layer with an (110) orientation as compared to an (100) orientation, so the semiconductor structure of FIG. 7 would be expected to be inferior to the semiconductor structure of FIG. 5.

Figure 8:
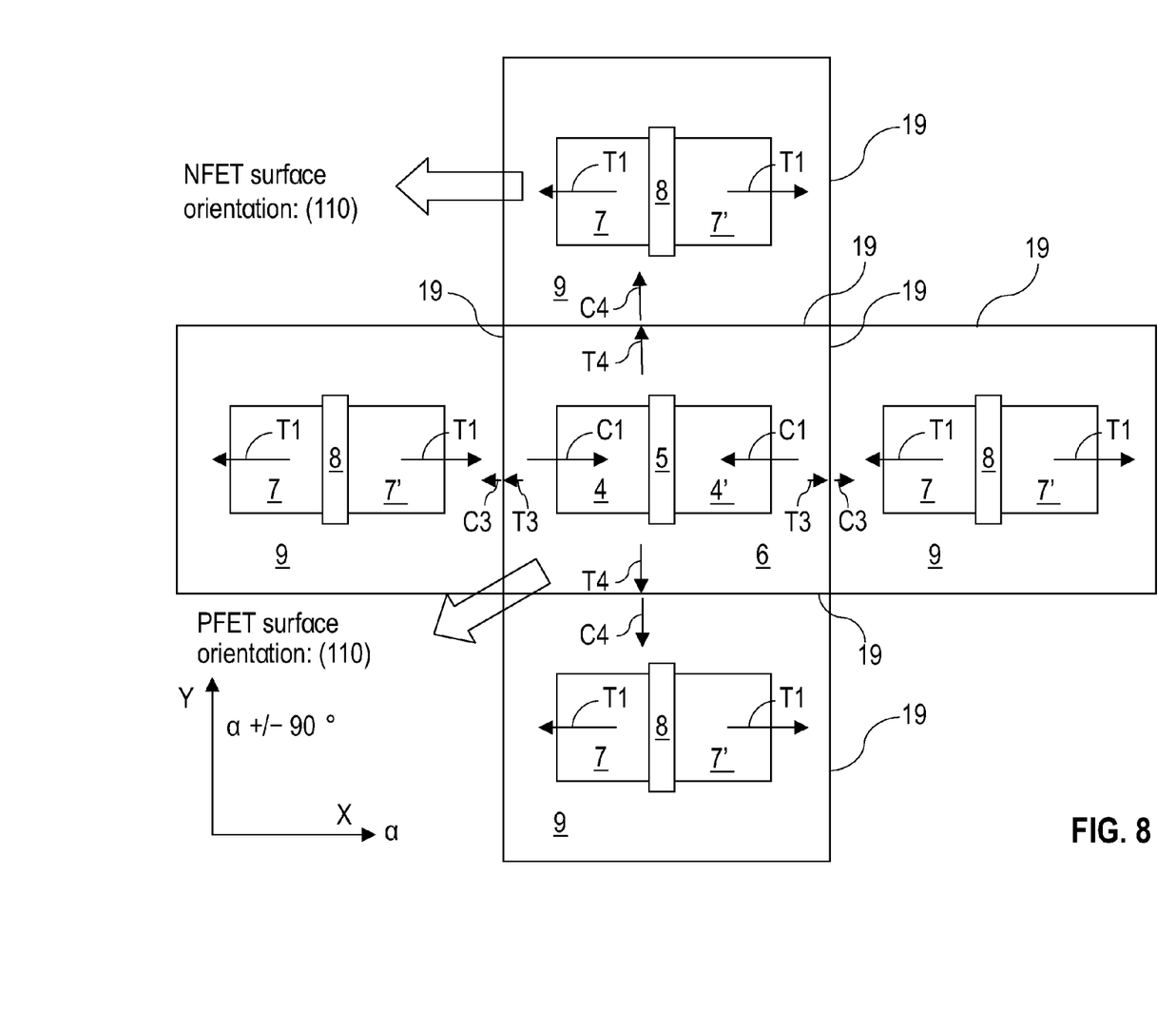

Referring to FIG. 8, a fourth exemplary semiconductor structure comprises a PFET and at least one NFET and stress liners in the same arrangement as in the second exemplary semiconductor structure. However, a silicon layer having the same crystallographic orientation throughout is employed for the first silicon layer and the second silicon layer. The relationship among the crystallographic direction of the silicon layer, the direction of current flow in the PFET channel, and the lengthwise direction of the PFET gate line 5 is the same as the relationship among the crystallographic directions of the first silicon layer, the direction of current flow in the PFET channel, and the lengthwise direction of the PFET gate line 5 in the second exemplary semiconductor structure. Specifically, the silicon layer has a (110) surface orientation, an azimuthal angle α (not shown) between the direction of current flow in the PFET channel and an in-plane [1 $\bar{1}$ 0] crystallographic direction in the (110) silicon layer is from about 25° to about 55°, and the angle between a lengthwise direction of the PFET gate line 5 and the [1 $\bar{1}$ 0] crystallographic direction is substantially α+/90°. Further, another azimuthal angle α' (not shown) between the direction of current flow in the at least one NFET channel and the [1 $\bar{1}$ 0] crystallographic direction is the same as the azimuthal angle α, and the angle between a lengthwise direction of the at least one NFET gate line 8 and the [1 $\bar{1}$ 0] crystallographic direction is substantially α+/−90°, i.e., the same as the angle between a lengthwise direction of the PFET gate line 5 and the [1 $\bar{1}$ 0] crystallographic direction. The advantageous effects of various stresses generated by the compressive stress liner over the PFET and the tensile stress liner over the at least one NFET on enhancement of performance of the PFET are the same as in the second exemplary semiconductor structure. However NFET performance is substantially better in a silicon layer with a (100) surface orientation as compared to a (110) surface orientation, so the semiconductor structure of FIG. 8 would be expected to be inferior to the semiconductor structure of FIG. 6.

While the PFET and NFETs of the semiconductor structures of FIGS. 5, 6, 7, and 8 are shown with a particular longitudinal spacing and a particular transverse spacing, though both with an unspecified dimensional scale, it should be noticed (i) that secondary tensile stresses are most beneficial to neighboring PFETs when secondary longitudinal tensile stresses are minimized and secondary transverse tensile stresses are maximized and (ii) that the effects of these secondary stresses generally increase as FET dimensions and PFET-to-NFET spacings shrink. In a preferred geometry, liner boundary 19 is separated transversely from the edges of the PFET source regions and the PFET drain regions by less than 0.3 μm and separated longitudinally from a center line along the lengthwise direction of the PFET gate line 5 by at least 0.3 μm.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
a substrate containing a first silicon layer having a (110) surface orientation;
a p-type field effect transistor (PFET) located on said first silicon layer and containing a PFET channel between a PFET source region and a PFET drain region, wherein an azimuthal angle between a direction of current flow in said PFET channel and an in-plane [1 $\bar{1}$ 0] crystallographic direction in said first silicon layer is from about 25° to about 55°;
a PFET gate line located over said PFET channel;
a compressive stress liner located on said PFET gate line, a PFET source region, and a PFET drain region, wherein said compressive stress liner produces a compressive longitudinal strain in said PFET channel;
a second silicon layer having a (001) surface orientation;
an n-type field effect transistor (NFET) located on said second silicon layer and containing an NFET channel, an NFET source region, and an NFET drain region;
an NFET gate line located over said NFET channel; and
a tensile stress liner located on said NFET gate line, said NFET source region, and said NFET drain region, wherein said tensile stress liner produces a tensile longitudinal strain in said NFET channel and a secondary tensile transverse stress in said PFET channel.

2. The semiconductor structure of claim 1, wherein said PFET gate line and said NFET gate line have a same lengthwise direction.

3. The semiconductor structure of claim 2, wherein said NFET gate line is aligned with an in-plane [110] crystallographic direction in said second silicon layer.

4. The semiconductor structure of claim 1, wherein said azimuthal angle is in a range from about 25° to an angle between said [1 $\bar{1}$ 0] crystallographic direction and an in-plane [1 $\bar{1}$ 1] crystallographic direction in said first silicon layer.

5. The semiconductor structure of claim 1, wherein said azimuthal angle is in a range from an angle between said [1 $\bar{1}$ 0] crystallographic direction and an in-plane [1 $\bar{1}$ 1] crystallographic direction to about 55°.

6. The semiconductor structure of claim 5, wherein said direction of current flow in said PFET channel is substantially along a [1 $\bar{1}$ $\sqrt{2}$] crystallographic direction and said azimuthal angle is substantially 45°.

7. The semiconductor structure of claim 1, wherein said substrate is a hybrid orientation substrate containing a bulk portion and a semiconductor-on-insulator (SOI) portion.

8. The semiconductor structure of claim 7, wherein said bulk portion contains said first silicon layer and said SOI portion contains said second silicon layer.

9. The semiconductor structure of claim 7, wherein said bulk portion contains said second silicon layer and said SOI portion contains said first silicon layer.

10. The semiconductor structure of claim 1, wherein said substrate is a hybrid orientation substrate containing a bulk portion and a direct-silicon-bonded (DSB) portion.

11. The semiconductor structure of claim 1 further comprising a boundary between said tensile stress liner and said compressive stress liner, said boundary separated transversely from edges of said PFET source region and said PFET drain region by less than 0.3 μm and separated longitudinally from a center line along a lengthwise direction of said PFET gate line by at least 0.3 μm.

12. The semiconductor structure of claim 1, further comprising;
at least another n-type field effect transistor (NFET) located on said second silicon layer and containing at least another NFET channel, at least another NFET source region, and at least another NFET drain region;
at least another NFET gate line located over each of said at least another NFET channel, wherein said tensile stress liner is located on said at least another NFET gate line, said at least another NFET source region, and said at least another NFET drain region, and wherein said tensile stress liner produces a tensile longitudinal strain in each of said at least one NFET channel.

13. A semiconductor structure comprising:
a substrate containing a silicon layer having a (110) surface orientation;
a p-type field effect transistor (PFET) located on said silicon layer and containing a PFET channel between a PFET source region and a PFET drain region, wherein an azimuthal angle between a direction of current flow in said PFET channel and a [1 $\bar{1}$ 0] crystallographic direction is from about 25° to about 55°;
a PFET gate line located over said PFET channel;
a compressive stress liner located on said PFET gate line, said PFET source region, and said PFET drain region, wherein said compressive liner applies a compressive longitudinal strain to said PFET channel;
an n-type field effect transistor (NFET) located on said silicon layer, said NFET containing an NFET channel between an NFET source region and an NFET drain region, wherein an angle between a direction of current flow in said NFET channel and a [1 $\bar{1}$ 0] crystallographic direction is from about 25° to about 55°;
a NFET gate line located over said NFET; and
a tensile stress liner located on said NFET gate line, said NFET source region, and said NFET drain region, wherein said tensile stress liner applies a primary compressive longitudinal strain to said NFET channel and a secondary tensile transverse stress to said PFET channel.

14. The semiconductor structure of claim 13, wherein said PFET gate line and said at least one NFET gate line have a same lengthwise direction.

15. The semiconductor structure of claim 13, wherein said azimuthal angle is in a range from about 25° to an angle between said [1 $\bar{1}$ 0] crystallographic direction and an in-plane [1 $\bar{1}$ 1] crystallographic direction.

16. The semiconductor structure of claim 13, wherein said azimuthal angle is in a range from an angle between said [1 $\bar{1}$ 0] crystallographic direction and an in-plane [1 $\bar{1}$ 1] crystallographic direction and about 55°.

17. The semiconductor structure of claim 16, wherein said direction of current flow in said channel is substantially along an in-plane [1 $\bar{1}$ $\sqrt{2}$] crystallographic direction and said azimuthal angle is substantially 45°.

18. The semiconductor structure of claim 13, wherein said substrate is a bulk substrate.

19. The semiconductor structure of claim 13, further comprising shallow trench isolation, wherein said PFET and said NFET are separated by said shallow trench isolation and said compressive stress liner and said tensile stress liner overlap on said shallow trench isolation.

20. The semiconductor structure of claim 19, farther comprising:
- at least another n-type field effect transistor (NFET) located on said silicon layer and containing at least another NFET channel, at least another NFET source region, and at least another NFET drain region;
- at least another NFET gate line located over each of said at least another NFET channel, wherein said tensile stress liner is located on said at least another NFET gate line, said at least another NFET source region, and said at least another NFET drain region, and wherein said tensile stress liner produces a tensile longitudinal strain in each of said at least one NFET channel.

21. The semiconductor structure of claim 13, further comprising a boundary between said tensile stress liner and said compressive stress liner, said boundary separated transversely from edges of said PFET source region and said PFET drain region by less than 0.3 μm and separated longitudinally from a center line along a lengthwise direction of said PFET gate line by at least 0.3 μm.

* * * * *